United States Patent
Hsuan et al.

(10) Patent No.: US 6,239,367 B1
(45) Date of Patent: *May 29, 2001

(54) MULTI-CHIP CHIP SCALE PACKAGE

(75) Inventors: Min-Chih Hsuan, Hsinchu; Cheng-Te Lin, Taipei Hsien, both of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/241,340

(22) Filed: Feb. 1, 1999

(51) Int. Cl.[7] .................................................. H01L 23/02
(52) U.S. Cl. .................. 174/52.4; 257/685; 257/689; 257/723; 257/777; 361/734; 361/738; 361/811
(58) Field of Search ........................... 174/52.4; 257/777, 257/723, 685, 689; 361/766, 774, 738, 811

(56) References Cited

U.S. PATENT DOCUMENTS

| | | | | |
|---|---|---|---|---|
| 5,285,352 | * | 2/1994 | Pastore et al. | 361/707 |
| 5,331,235 | * | 7/1994 | Chun | 257/777 |
| 5,681,777 | * | 10/1997 | Lynch et al. | 437/182 |
| 5,910,685 | * | 6/1999 | Watanabe et al. | 257/777 |
| 5,945,741 | * | 9/1999 | Ohsawa et al. | 257/777 |

* cited by examiner

Primary Examiner—William A. Cuchlinski, Jr.
Assistant Examiner—Ronnie Mancho

(57) ABSTRACT

A multi-chip chip scale package. The package has a film carrier whereby two chips with different sizes can be disposed on the same film carrier. A flip chip technique is used to arrange each chip on each side of the film carrier face to face. A bump is formed on each chip to electrically connect with the film carrier. An insulation material is filled in between the chips to leave one side of each chip exposed. The conductive wires of the film carrier are connected to the chips directly.

23 Claims, 3 Drawing Sheets

MULTI-CHIP CHIP SCALE PACKAGE

BACKGROUND OF THE INVENTION

1. Field of the Invention

The invention relates to a semiconductor packaging structure, and more particularly, to a multi-chip chip scale package (CSP).

2. Description of the Related Art

As the technology of semiconductor fabrication grows more and more advanced, the relevant techniques have to be further developed to coordinate the requirements of the semiconductor devices. The fabrication process of a semiconductor device typically includes three stages. In the first stage, an epitaxy technique is used for the formation of a semiconductor substrate. Semiconductor devices such as metal-oxide semiconductor (MOS) and multilevel interconnection are fabricated on the substrate in the second stage. The third stage is the packaging process. It is now a leading trend for fabricating a device or an electronic product with a thin, light, and small dimension, that is, with a higher integration for semiconductor devices. In terms of packages, many techniques such as chip scale package, multi-chip module (MCM) have been developed to obtain a high integration. The development of the fabrication technique with a line width of 0.18 µm has evoked a great interest and intensive research to further decrease the package volume. It is thus one of the very important package techniques to arrange more than one chip into a single package. In a multi-chip package, chips of processor, memory, including dynamic random access memory (DRAM) and flash memory, and logic circuit can be packed together in a single package to reduce the fabrication cost and the packaging volume. Furthermore, the signal transmission path is shortened to enhance the efficiency. The multi-chip IC packaging technology may also be applied to a multi-chip system with variable functions and operation frequencies, for example, 1. A system comprises memory chips, microprocessors, resistors, capacitors, and inductors.
2. A system comprises memory chips (DRAM), logic circuit chips, and memory chips (Flash memory),
3. A system comprises analog chips, logic circuit chips, memory chips (including DRAM, SRAM, Flash memory), resistor, capacitor, and inductor.

In FIG. 1, a conventional multi-chip module is shown. A multi-level printed circuit board (PCB) is typically applied as a substrate of the to the carrier of a multi-chip module. More than one chip 12 are adhered on the substrate 10 by insulation glue 14. The bonding pads on the chip 12 are electrically connected with the terminals on the substrate 10 by conductive wires 16. In addition to wire bonding, the connection between the chip 12 and the substrate 10 can also be established by flip chip or controlled collapse chip connection (C4) with the formation of a bump. A resin 18 is used to seal the chip 12, and the electrical connection between the whole package and a printed circuit board can be achieved by ball grid array (BGA) which use solder balls 20 to connect the terminals on the printed circuit board. The drawback of this conventional multi-chip module is that a large surface is occupied since chips are packaged on the same side of a surface. Therefore the surface are of the package is large, and the signal path between chips is long. In addition, though the volume of the package can be reduced by using flip chip technique to achieve the connection between the chip and the carrier, a known good die (KGD) method has to be used for testing. A low yield and a high cost are thus resulted.

To further shrink the volume of a package, a face to face multi-chip package is disclosed in U.S. Pat. No. 5,331,235. In FIG. 2, this multi-chip package comprises two chips 30 and 32 disposed face to face by way of tape automatic bonding (TAB). FIG. 2 illustrates inner lead bonding (ILB), whereby two chips 30, 32 having bumps 34, 36 are electrically connected to the film carrier 38. FIG. 2 further illustrates outer lead bonding (OLB), whereby the chips 30, 32 are connected to a lead frame 40. A solder ball 42 is formed between the chips 30, 32. The chips 30, 32, the film carrier 38 and the lead frame 40 are then molded resin 44. This multi-chip package uses tape automatic bonding technique. The electrical connection between chips and printed circuit board is achieved by the installation of a lead frame or other carriers. The signal transmission path is lengthened. In addition, a large thickness and surface area are resulted by using the molding material (resin) of package. The applicability is reduced, and the heat dissipation is not effective. Moreover, this kind of package can not applied to high frequency products.

SUMMARY OF THE INVENTION

The invention provides a multi-chip chip scale package with a reduced thickness and surface area. More than one chip can be packaged on one carrier. The surface area is substantially the same or slightly bigger than the largest chip being packaged therein. The multi-chip chip scale package has a shortened signal transmission path to enhance the performance of the chips.

The above multi-chip chip scale package has an enhanced performance of heat dissipation. The heat dissipation can be performed by ways of metal plate or printed circuit on a printed circuit board, or alternatively, by an additional heat dissipation apparatus.

Furthermore, the test of chip package can be performed during package process without using known-good die method. Circuit components can be disposed on a carrier and packaged with the chip package to widen the field of application.

To achieve the above-mentioned objects and advantages, a multi-chip chip scale package is provided. A film carrier is used to carry multiple chips. Using flip chip technique, these chips are disposed face-to-face on two sides of the film carrier. Each of the chips has a bump connecting to the film carrier. An insulation material is filled in between the chips, while the other side of each of the chips is bared. Accordingly, the thickness of the package is reduced, and the performance of heat dissipation is enhanced. Moreover, conductive wires are formed on the film carrier to directly connect an external signal. The signal transmission path is shortened without going through an additional carrier.

While arranging the multi-chip chip scale package on a printed circuit board, the chip may have a side directly connected to a printed circuit or metal plate on the printed circuit board to provide advantageous heat dissipation. An additional heat dissipation apparatus may also be installed on a surface of the other chip in the far end of the printed circuit board. The heat dissipation effect is thus further enhanced. In addition, at least one locating hole is formed on the insulation film and filled by the insulation material, so that the chip can be connected to the film carrier more stably. Moreover, circuit components such as in inductor can be disposed on the film carrier to electrically connect the chip. Both the chips and the circuit components can be packaged on the same film carrier. Therefore, the field of application of this package is widened. As a consequence, an improved packaging quality and an enhanced reliability are obtained.

Both the foregoing general description and the following detailed description are exemplary and explanatory only and are not restrictive of the invention, as claimed.

DESCRIPTION OF THE PREFERRED EMBODIMENTS

During the process of packages, several stages are typically included:

1) Selection of carriers: types of chips have to be selected according to specific requirement, for example, lead frame, film carrier, or printed circuit board. The film carriers are commonly used for the technique of tape automatic bonding (TAB);

2) Electrical connections between chips and carriers: currently, techniques such as wire bonding, film automatic bonding, and flip chip or controlled collapse chip connection (C4) have been developed and widely used; and 3) Package and device sealing: chips and carriers are covered or sealed by resin, ceramic or other packaging material to protect the devices on the chips and the connections between the chips and the carriers.

Figure 1:
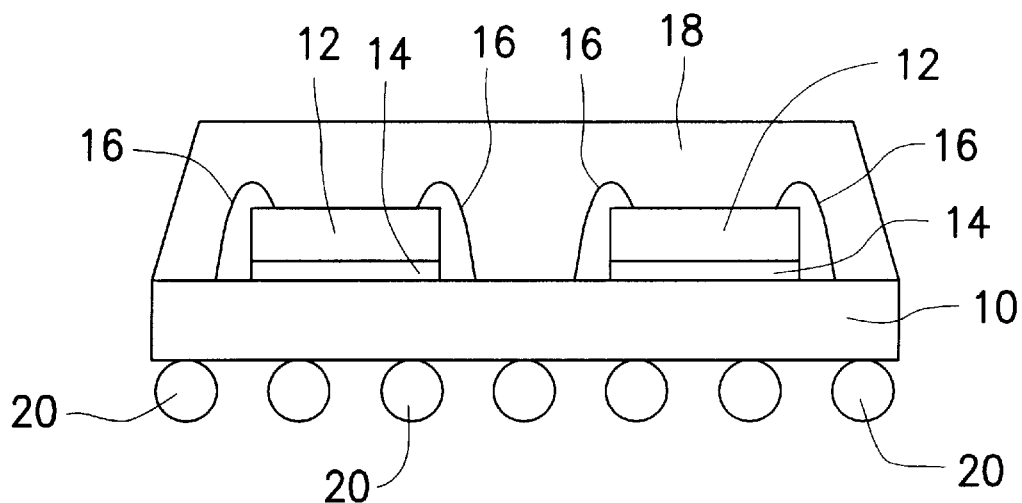
FIG. 1 shows a conventional multi-chip module package.
Figure 2:
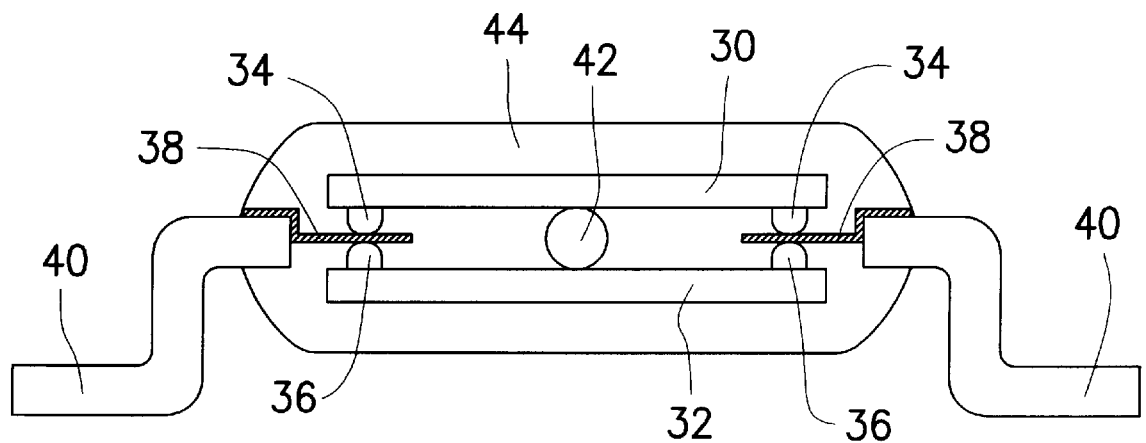
FIG. 2 is a cross sectional view showing a conventional face-to-face multi-chip module package.
Figure 3:
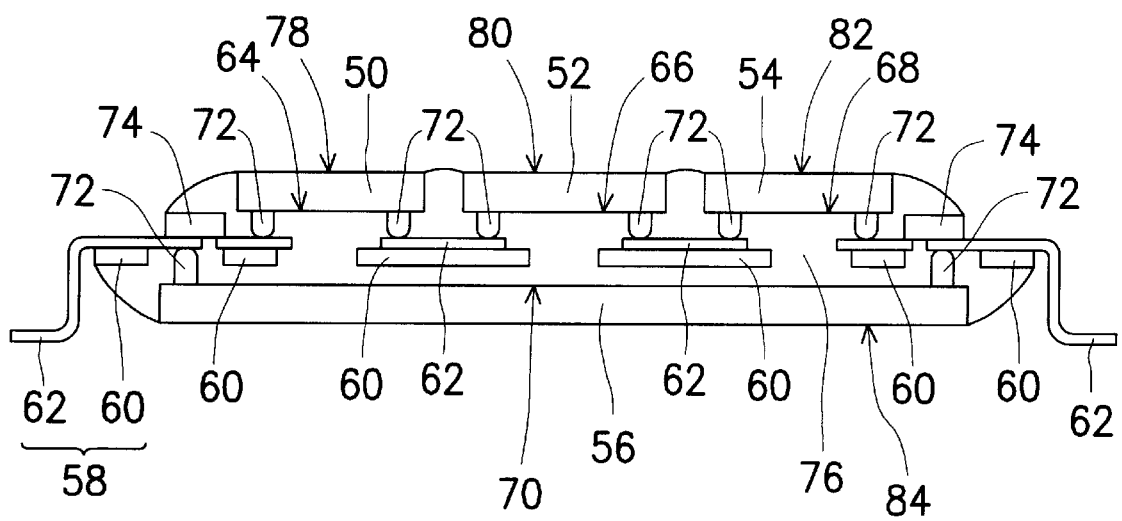
FIG. 3 is a cross sectional view showing a multi-chip chip scale package in a preferred embodiment according to the invention.

In FIG. 3, a cross sectional view of a multi-chip chip-scale package is shown. In the invention, multiple chips 50, 52, 54 and 56 with various sizes are packed into one package with a size substantially the same as the total volume of these chips 50 to 56. Chips 50 to 56 may include DRAM, ROM, LOGIC or ANALOG circuits, or other devices. Regarding to the selection of carrier, a film carrier 58 is chosen in this embodiment. As shown in the figure, the film carrier 58 comprises an insulation film 60 and conductive wires 62 on the insulation film 60. Since the conductive wires 62 of film carrier 58 have a thinner and narrower dimension compared to conductive wires used in other kinds of carriers, this kind of package can be applied in high frequency device.

The technique of flip chip (or C4) is applied to achieve electrical connection between the chip 50 to 56 and the film carrier 58. By the flip chip technique used in the invention, the thickness of the package can be reduced, and the signal transmission path can be shortened. The chips 50 to 56 may comprise several devices on surfaces 64, 66, 68 and 70 thereof, respectively. Bonding pads (not shown) may be formed on the surfaces 64 to 70, while bumps 72 are formed on these bonding pads. The chips 50 to 56 are disposed with face to face on opposite sides of the film carrier 58. Via the bumps 72 and the conductive wires 62, the chips 50 to 56 are electrically connected. In addition to the conductive wires 62, circuit components 74 such as a resistor, capacitor, inductor, can also be formed on the insulation film 60 and connected with the chips 50 to 66 by means of the conductive wires 62. Thus, the package is more applicable in various fields such as communication equipment, computing system, or even as a system in one.

In the part of package and device sealing, an insulation material 76 such as epoxy is used and filled between the chips 50 to 56. It is worth mentioning that the insulation material 76 is filled between the surfaces 64 to 70 of the chips 50 to 56 only to protect devices on the surfaces 64 and 70. Whereas, the other sides 78, 80, 82 and 84 of the chips 50 to 56 are exposed to reduce the package dimension and to provide a heat dissipation path.

Since the conductive wires 62 of the film carrier 58 are used to achieve signal transmission from the chips 50 to 56 and the circuit components 74 to an external device or system without an additional carrier, the signal transmission path is thus reduced. As shown in the figure, the conductive wires 62 are then bent and configured to form the curve or shape as specifically required. The forming process of the conductive wires 62 and the subsequent surface mount technique (SMT) between the conductive wires 62 and a printed circuit board are prior techniques which are not to be introduced here.

Figure 4:
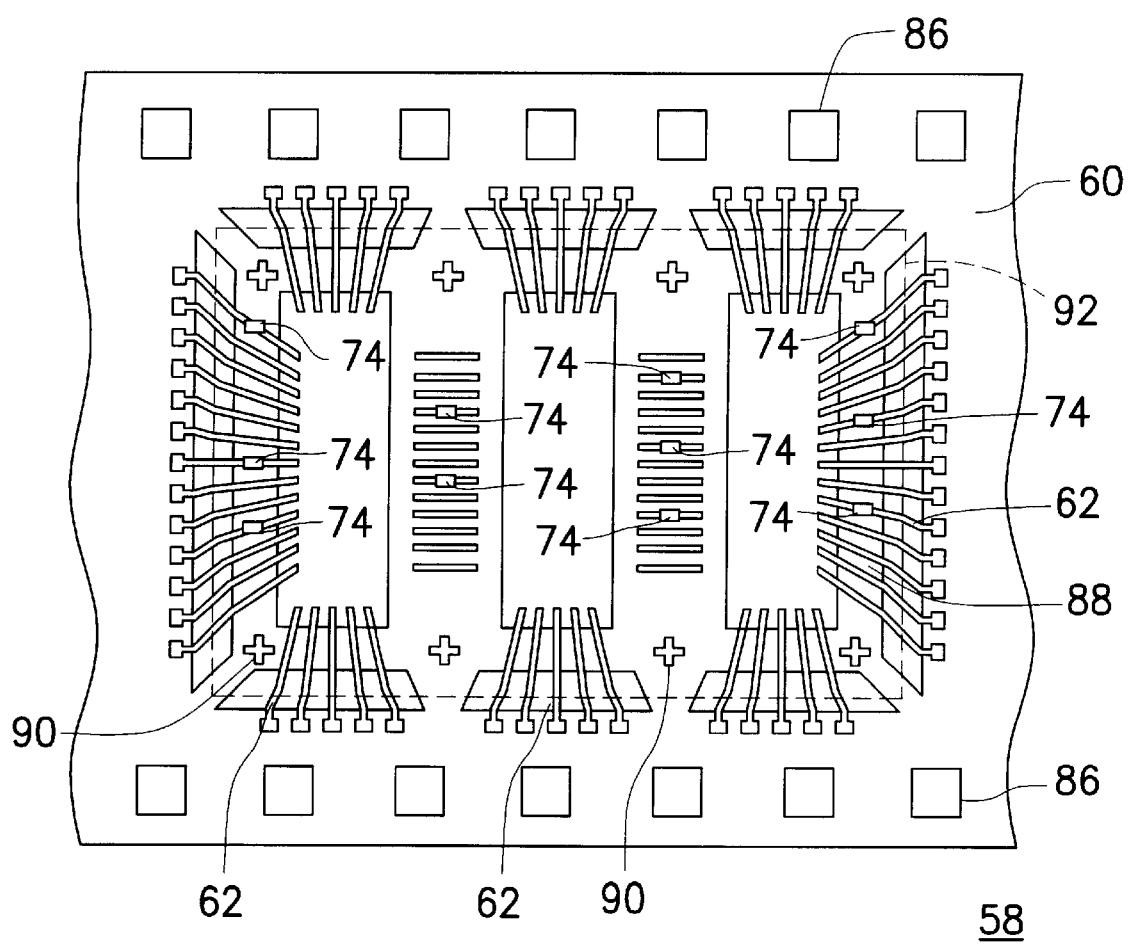
FIG. 4 shows a film carrier used in a preferred embodiment according to the invention.

FIG. 4, is a top view of the film carrier 58 as shown in FIG. 3 before the chips 50 to 56 are disposed on the film carrier 58. The film carrier 58 comprises an insulation film 60 and conductive wires 62, for example, copper wires, arranged on the insulation film 60. Typically, film carrier 58 are in a strip shape and flexible before being packaged. In automatic production, the insulation film 60 has leading holes 86 at two ends thereof to enable the conveyance of film carrier 58. The insulation film 60 may further comprise a corner supported ring 88 with corner parts connected with the main body of the insulation film 60. The corner supported ring 88 is beset by the insulation film 60 and connected with the main body of the insulation film 60 through the corner of the corner supported ring 88. As a consequence, the conductive wires 62 can be arranged on the corner supported ring 88 to improve the stability. The corner supported ring 88 may be taped on the conductive wires 62 or be formed integrally with the insulation film 60. To enhance the fixture of the insulation material 76, locating holes 90 in a shape, for example, a cross shape, round shape, rectangular shape, or other geometric shape, are formed on the corner supported ring. A dash-line frame 92 as shown in FIG. 4 is the region where the chips 50 to 56 are disposed. After the chips 50 to 56 are disposed on the insulation film 60 and the subsequent package process is performed, the conductive wires 62 and the insulation film 60 are cut along the dash-line to form a package including chips 50 to 56 as shown in FIG. 3. In FIG. 4, while the insulation material 76 is filled between the chips 50 to 56 within a range as shown as the dash-line frame 92, the locating holes 90 (as shown in FIG. 4) are filled with the insulation 76. As a consequence, the fixture of the insulation material 76 is improved, and the fixing effect between the chips 50 to 56 and the film carrier 58 is enhanced.

Moreover, the circuit components 74 can be disposed on the film carrier 58 and connected with the chips 50 to 56 via the conductive wires 62. Thus, the package may be applied into various fields with different functions and range of frequencies. For example, the package may be applied to communication equipment, computing system, or even a system in one chip. In the example as shown in FIG. 4, the chips 50, 52, 54 are arranged abreast on the film carrier 58. It is appreciated that people skilled in the art may arrange multiple chips in various sizes on a film carrier in different allocation. The multiple chips may also be arranged on a film carrier by assembling circuit components.

Figure 5:
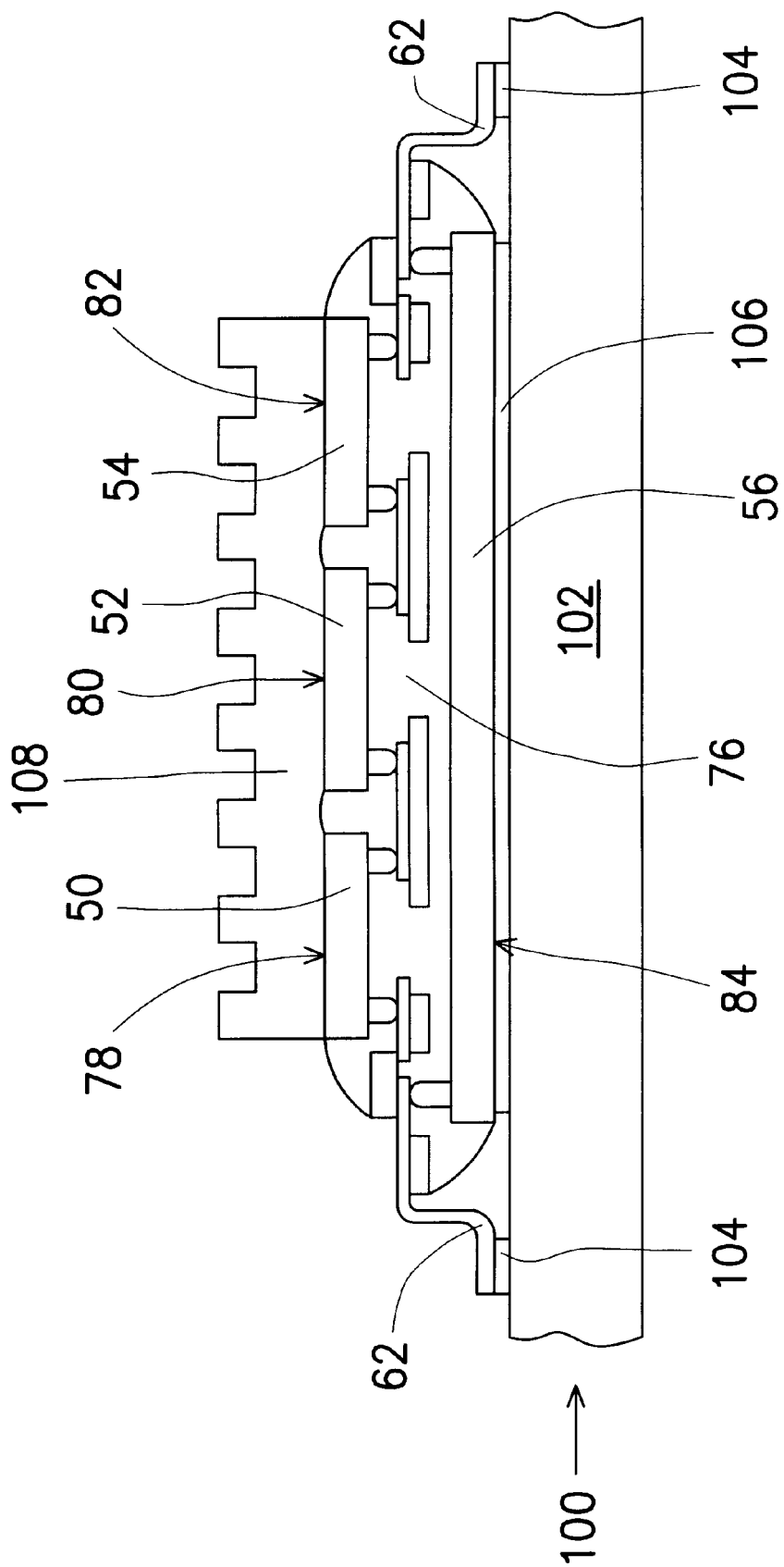
FIG. 5 is a cross sectional view of applying a multi-chip chip scale package in the invention to a printed circuit board.

FIG. 5 shows the application of a multi-chip chip scale package on a printed circuit board. A printed circuit board 100 typically comprises a substrate 102 and printed circuits 104 and 106. The substrate 102 is, for example, a multi-level printed circuit board formed by lamination. The material of the printed circuits 104 and 106 includes, for example, copper foil. In the invention, the printed circuit board 100 electrically connects with the conductive wires 62 of the film carrier 58 directly. Thus, the signal transmission path is shorter compared to the prior technique which achieve the connection between the conductive wires of the film carrier and the printed circuit board 100 by, for example, surface mount technique. In the invention, the insulation material 76 is filled in between the surfaces 64 to 70 of chips 50 to 56 to leave the surfaces 78 to 84 exposed or bared. While disposing the package of the chip 50 to 56 onto the printed circuit board 100, as shown in the figure, the bared surface 84 of the chip 56 is directly in contact with the printed circuit 106. While the printed circuit 106 is connected with the ground on the printed circuit 106 to enlarge the surface area, the heat dissipation effect is improved because of the increased surface area. In addition, a heat dissipating apparatus 108 such as a heat sink or a heat spreader may be installed over the surface 78, 80, 82 of the chips 50, 52, 54 at a far side of the printed circuit 100 to provide a heat dissipation path for the chip 50, 52, 54.

It is to be noted that using the film carrier, a test of the chip package can be performed during packaging process without employing the conventional known-good die method. Thus, the cost can be reduced.

In summary, the advantages of the invention includes at least:

1) The thickness and surface area are reduced by the application of multi-chip chip scale package. The size of the package is only slightly larger than the chip dimension.

2) The conductive wires of the film carrier directly electrically connect to the chip for signal transmission, so that the signal transmission path between the chip and the printed circuit board is shortened, the performance of the chip is thus enhanced.

3) The invention adapts the bared-chip package, so that the performance of heat dissipation is enhanced. The heat can be dissipated by ways of the printed circuit on the printed circuit board, metal plate, or additional heat dissipation apparatus.

4) The package test can be performed directly to the chip while being packaged without performing the process of known-good die.

5) The formation of locating holes improves the fixture of insulation material filled in between the chip and the film carrier, so that the chip can be disposed on the film carrier more stably.

6) circuit components can be arranged on the film carrier of the package directly. By way of the conductive wires, both the electrical connection and the signal transmission thereof can be achieved. Thus, this kind of package can be applied in various fields of invention.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A multi-chip chip scale package, comprising:
   a film carrier, further comprising:
   an insulation film, wherein the insulation film comprises a peripheral region and an inter-layer region and the inter-layer region isolates a hollow region enclosed by the peripheral region into a plurality of chip disposing regions; and
   a plurality of conductive wires, arranged on the insulation film both in the peripheral region and the inter-layer region;
   a plurality of chips, respectively disposed over the chip disposing regions and the hollow region respectively on each side of the insulation film with inner surfaces respectively located over the chip disposing regions face to the inner surface of the chip located over the hollow region and each of the inner surfaces of the chips having a plurality of bumps respectively connecting with the conductive wires respectively disposing on the peripheral region and the inter-layer region of the isolation film;
   at least a circuit component, on the film carrier and electrically connected to the conductive wires; and
   an insulation material, filled in between the chips to seal the inner surfaces, while the chips have their outer surfaces exposed.

2. The package according to claim 1, wherein the insulation material is filled to cover a part of the insulation film.

3. The package according to claim 1, wherein the insulation film further comprises a plurality of leading holes at two ends thereof.

4. The package according to claim 1, wherein the film carrier further comprises at least one locating hole filled by the insulation material.

5. The package according to claim 1, wherein the insulation film further comprises a corner supported ring beset by the insulation film to further support the conductive wires.

6. The package according to claim 5, wherein the corner supported ring have a plurality of corners connected with the insulation film.

7. The package according to claim 5, wherein at least one of the corners has at least a locating hole.

8. The package according to claim 1, wherein the circuit component comprises an inductor.

9. The package according to claim 1, wherein the circuit component comprises a resistor.

10. The package according to claim 1, wherein the circuit component comprises a capacitor.

11. A printed circuit board having a package disposed thereon, comprising:
    a substrate; and
    a plurality of printed circuits on the substrate;
    wherein the package comprises:
    a film carrier, further comprising:
    an insulation film, wherein the insulation film comprises a peripheral region and an inter-layer region and the inter-layer region isolates a hollow region enclosed by the peripheral region into a plurality of chip disposing regions; and
    a plurality of conductive wires, arranged on the insulation film both in the peripheral region and the inter-layer region;
    a plurality of chips, respectively disposed over the chip disposing regions and over the hollow region respectively on each side of the insulation film with inner surfaces respectively located over the chip disposing regions face to the inner surface of the chip located over the hollow region and each of the inner surfaces of the chips having a plurality of bumps respectively connecting with the conductive wires respectively disposing on the peripheral region and the inter-layer region of the isolation film;

at least a circuit component, on the film carrier and electrically connected to the conductive wires; and an insulation material, filled in between the chips to seal the inner surfaces, while the chips have their outer surfaces exposed.

12. The printed circuit board according to claim 11, wherein at least one of the back side of the chips is in contact with at least one of the printed circuit.

13. The printed circuit board according to claim 12, wherein a heat dissipation apparatus is installed over at least one of the back side of the chips.

14. The printed circuit board according to claim 13, wherein the heat dissipation apparatus comprises a heat spreader.

15. The printed circuit board according to claim 13, wherein the heat dissipation apparatus comprises a heat sink.

16. The printed circuit board according to claim 11, wherein the insulation film further comprises at least a locating hole filled by the insulation material.

17. The printed circuit board according to claim 11, wherein the substrate comprises a multi-level printed circuit board.

18. The package according to claim 11, wherein the insulation film further comprises a corner supported ring beset by the insulation film to further support the conductive wires.

19. The package according to claim 11, wherein the corner supported ring have a plurality of corners connected with the insulation film.

20. The package according to claim 11, wherein at least one of the corners has at least a locating hole.

21. The package according to claim 11, wherein the circuit component comprises an inductor.

22. The package according to claim 11, wherein the circuit component comprises a resistor.

23. The package according to claim 11, wherein the circuit component comprises a capacitor.

* * * * *